United States Patent
LePetitcorps et al.

Patent Number: 5,571,561
Date of Patent: Nov. 5, 1996

[54] COATED FILAMENTS

[75] Inventors: Yann LePetitcorps, Leognan, France; Robert A. Shatwell, Farnham, England

[73] Assignee: The Secretary of State for Defence in Her Britannic Majesty's Government of the United Kingdom of Great Britain and Northern Ireland, Farnborough, United Kingdom

[21] Appl. No.: 138,012

[22] Filed: Oct. 19, 1993

[30] Foreign Application Priority Data

Oct. 27, 1992 [GB] United Kingdom ............. 9222594

[51] Int. Cl.$^6$ ............................................. C23C 16/00
[52] U.S. Cl. ............. 427/249; 427/248.1; 427/255; 427/255.7; 427/255.2
[58] Field of Search ............................. 428/367, 368, 428/373; 501/95; 427/249, 255, 255.7, 255.2

[56] References Cited

U.S. PATENT DOCUMENTS

| | | | |
|---|---|---|---|
| 2,962,388 | 11/1960 | Ruppert et al. | 427/249 |
| 2,962,399 | 11/1960 | Ruppert et al. | 427/249 |
| 3,642,522 | 2/1972 | Gass et al. | 427/249 |
| 3,667,100 | 6/1972 | Marchal et al. | 427/249 |
| 3,811,920 | 5/1974 | Galasso et al. | 428/368 |
| 4,055,700 | 10/1977 | Ronnquist et al. | 428/366 |
| 4,068,037 | 10/1978 | Debolt et al. | 428/368 |
| 4,127,659 | 11/1978 | DeBolt et al. | 427/349 |
| 5,041,305 | 8/1991 | Gruber | 427/249 |

FOREIGN PATENT DOCUMENTS

| | | |
|---|---|---|
| 2337214 | 7/1977 | France . |
| 64-87572 | 3/1989 | Japan . |

*Primary Examiner*—Patrick Ryan
*Assistant Examiner*—J. M. Gray
*Attorney, Agent, or Firm*—Nixon & Vanderhye P.C.

[57] ABSTRACT

A ceramic filament comprising a tungsten core and an outer layer of silicon carbide, the tungsten core and the outer layer being separated by an intermediate layer of titanium carbide. Also claimed is a process for the deposition of a titanium carbide coating on a tungsten filament which comprises heating the filament and passing the heated filament through a deposition chamber containing gases which on contact with the hot filament deposit the coating, the gases comprising a hydrocarbon and a titanium halogenated compound, said titanium halogenated compound contacting the tungsten filament before the hydrocarbon.

16 Claims, 5 Drawing Sheets

COATED FILAMENTS

BACKGROUND OF THE INVENTION

1. Field of the Invention

The present invention relates to a titanium carbide coated filament and a process for the preparation therefor.

2. Discussion of Prior Art

Coated filaments such as silicon carbide coated tungsten filaments are used to prepare composite materials. The length of time the composite can withstand high temperature is generally dictated by the tungsten/silicon carbide interface reaction.

A problem associated with the aforementioned coated filaments is that tungsten and silicon carbide react together. Tungsten carbides and silicides form at the tungsten/silicon carbide interface when the filament or composite is subjected to prolonged high temperature. This problem can arise either during fabrication of the composite or its subsequent use. The rate of growth of the reaction zone means the filament cannot withstand a temperature of 1000° C. for longer than three hours without losing strength.

SUMMARY OF THE INVENTION

We have now developed a coated filament which solves the aforementioned problem of instability at elevated temperatures by the incorporation of a titanium carbide intermediate layer between the tungsten and the silicon carbide.

Accordingly, the present invention provides a ceramic filament comprising a tungsten core and an outer layer of silicon carbide, said tungsten core and outer layer being separated by an intermediate layer of titanium carbide.

The present invention provides a coated tungsten filament which is stable to high temperatures for periods of time well in excess of three hours.

The intermediate layer of titanium carbide may suitably have a thickness of 0.5 microns or less, for example, 0.01 to 0.5 microns. Preferably, the layer is from 0.2 to 0.5 microns in thickness.

The outer surface of the coated filament comprises a layer of silicon carbide. Suitably, the silicon carbide layer has a thickness of from 25 to 75 microns, preferably from 35 to 60 microns. The coated filament having the titanium carbide and silicon carbide layers may suitably have a diameter of 65 to 185 microns.

If desired, one or more additional coatings of any suitable material may be deposited on to the outer silicon carbide layer as a protective coating. Where such layers are desired, the thickness of the protective layer may suitably be from 0.5 to 10 microns, preferably 1 to 5 microns.

Processes for the manufacture of silicon carbide coated filaments are well known. Typically, the core filament is electrically heated and passed through a Chemical Vapour Deposition (CVD) chamber containing gases which contain at least one silicon compound and at least one carbon compound and which under reaction conditions deposit silicon carbide on to the core filament. Typical processes are described in, for example, U.S. Pat. No. 4,127,659 and U.S. Pat. No. 3,622,369.

The deposition of the titanium carbide layer may also be deposited in a similar manner and according to another aspect of the invention there is provided a process for depositing a titanium carbide coating on a tungsten filament which comprises heating the filament and passing the heated filament through a deposition chamber containing gases which on contact with the hot filament deposit the coating, the gases comprising a hydrocarbon and a titanium halogenated compound, said titanium halogenated compound contacting the tungsten film before the hydrocarbon.

The titanium carbide layer may be laid down on the tungsten core, using gases which comprise at least one tungsten compound and at least one carbon compound and which decompose to produce a titanium carbide layer. In general, a mixture of hydrocarbons and a titanium halogenated compound may be used. Suitable decomposition temperatures may be in the range of from 700° to 1150° C., preferably 850° to 1050° C.

In a preferred process for laying down a titanium carbide layer, the gases comprise a hydrocarbon having 1 to 6 carbon atoms, for example, propane or propene and titanium tetrachloride. The laying down of the silicon carbide layer may suitably utilise gases which comprise an organochlorosilane, for example, dichloromethylsilane. In both cases hydrogen is present as a reducing gas.

The gases in the deposition chamber may also contain further components, for example, an inert carrier gas such as argon or neon.

In the laying down of the titanium carbide layer, the ratio of the carbon to titanium atoms in the gaseous feedstock may be in the range of from 0.5 to 4.0, preferably from 1.0 to 3.0.

In a preferred process, the tungsten core is coated with a layer of titanium carbide followed by deposition of a layer of silicon carbide. Suitably, the layers may be deposited consecutively in a single reactor having two consecutive chambers. This consists of a titanium carbide deposition chamber followed by a silicon carbide deposition chamber wherein the titanium carbide coated filament passes from the first chamber to the second chamber. Alternatively, the two deposition steps may be carried out independently wherein the tungsten core may be coated with titanium carbide, collected and then coated with silicon carbide at a later stage in a separate reactor. Alternatively, the layers may be deposited consecutively in a single reactor having one chamber. The chemicals leading to silicon carbide deposition being introduced downstream of those leading to titanium carbide deposition.

A preferred feature of the titanium carbide deposition chamber is to introduce the titanium tetrachloride and the hydrocarbon via two separate inlets. The titanium tetrachloride inlet must be positioned so that titanium halogenated gas contacts the tungsten core before the core contacts the hydrocarbon gas.

The deposition chamber(s) is preferably a vertical tube. Suitably, the gas inlet may be at the upper end of the tube and the outlet at the lower end of the tube. The tungsten filament may pass vertically downwards through the reactor. Alternatively, the tungsten filament may pass upwards through the reactor in which case the inlet and outlet will change position.

In order to promote efficient deposition of the titanium carbide layer, the tungsten filament is suitably heated to a temperature of from 900° to 1200° C. Most conveniently, the filament is heated by passage of an electric current supplied via two liquid metal electrodes through which the filament passes. These electrodes may contain pure mercury or liquid metal mixtures selected from mercury/indium, mercury/cadmium or gallium/indium.

According to another aspect of the invention there is provided a coated ceramic filament comprising a tungsten core and a titanium carbide coating.

BRIEF DESCRIPTION OF THE DRAWINGS

The deposition of the titanium carbide is illustrated in the accompanying drawing wherein.

DETAILED DISCUSSION OF PREFERRED EMBODIMENTS

Figure 1:
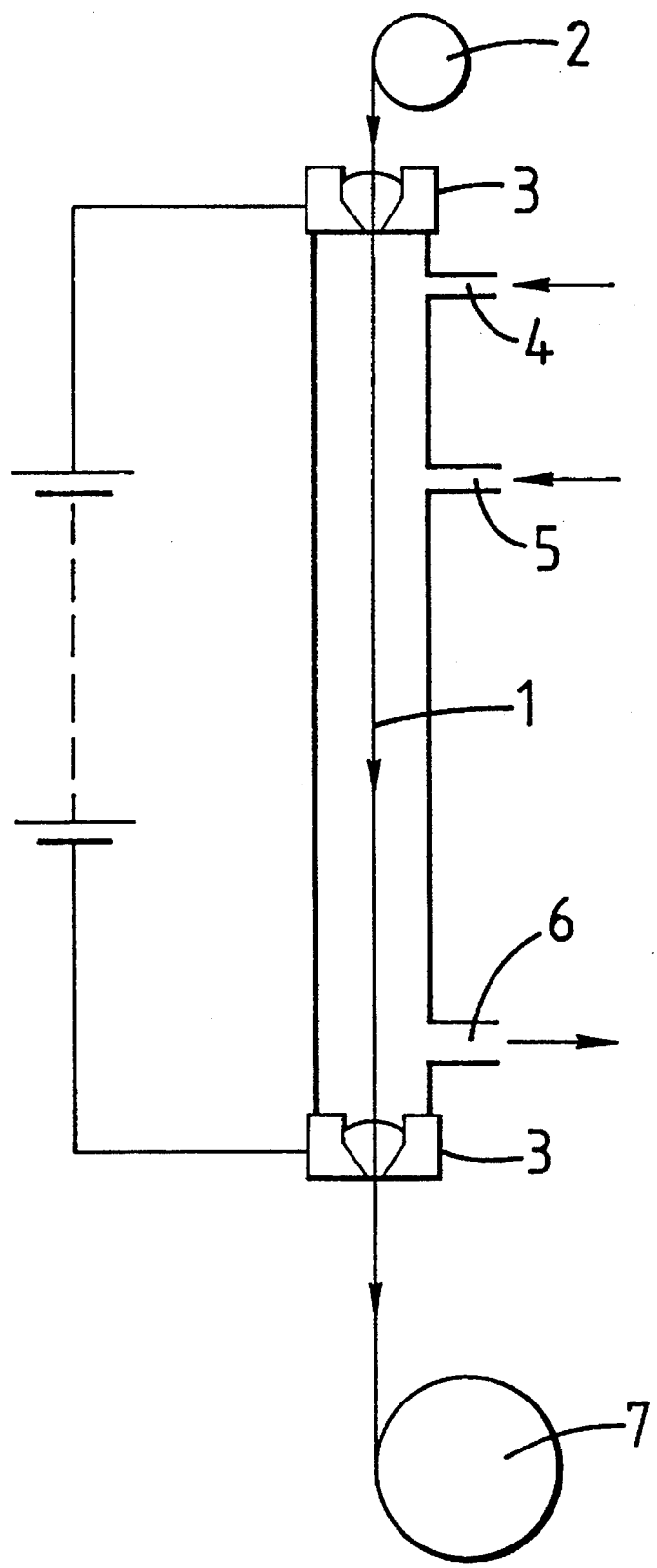
FIG. 1 is a side view of one embodiment of the present invention.

FIG. 1 shows an apparatus which may be used for the deposition of titanium carbide on to the tungsten core. A tungsten filament (1) is fed from a supply pool (2). The tungsten core is heated to a temperature of from 850° to 1050° C. by passage of an electric current via two mercury pool electrodes (3). A titanium tetrachloride/hydrogen mixture is introduced through a first feed port (4) just below the upper entry electrode under a flow rate of from 30 to 70 sccm. Propene and auxiliary hydrogen is introduced some distance below via a second feed port (5) under a flow rate of from 5 to 125 sccm. The separation of the feed ports depends on the speed of passage of the tungsten core through the reactor. At speeds of 1 to 2 m/min a suitable separation of the feed ports is 5 cm. The exhaust gases leave the reactor via exhaust port (6) just above the lower exit electrode. The titanium carbide coated tungsten is collected on a take-up spool (7).

The SiC coating may be deposited according to U.S. Pat. No. 4,127,659. If desired, a chamber (not shown) may be added to the bottom of the reactor, between the lower electrode (3) and the take-up spool (7). This may be used for the consecutive deposition of silicon carbide using, for example, dichloromethylsilane and hydrogen. Alternatively, the titanium carbide coated tungsten may be coated with silicon carbide at a later stage in a separate reactor.

Thermal Exposure Test

Figure 2:
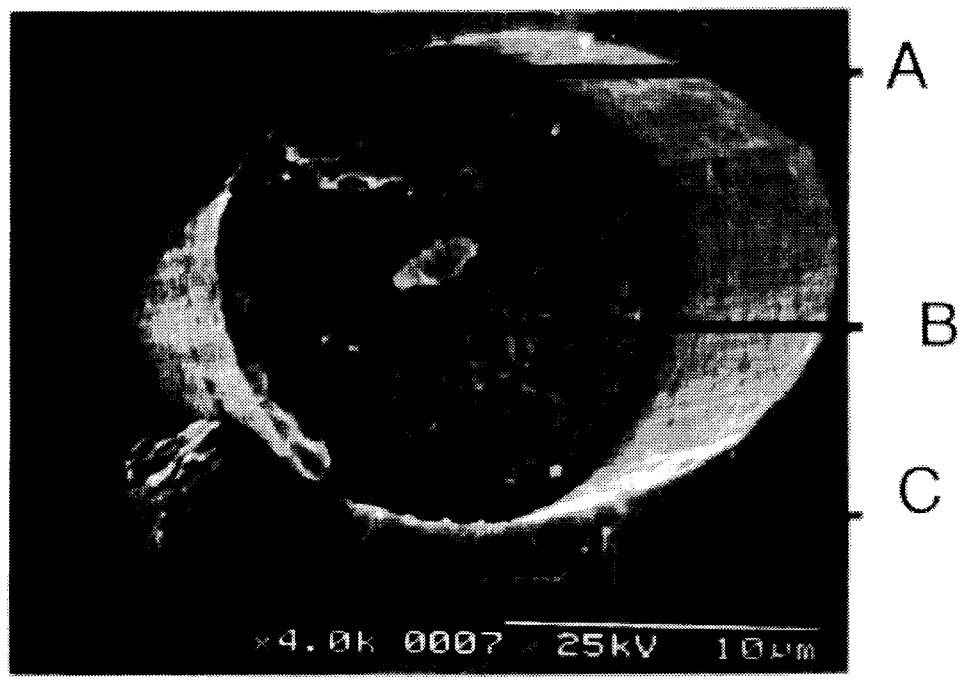
FIG. 2 is a photomicrograph of the filament produced by the method of the present invention.
Figure 3:
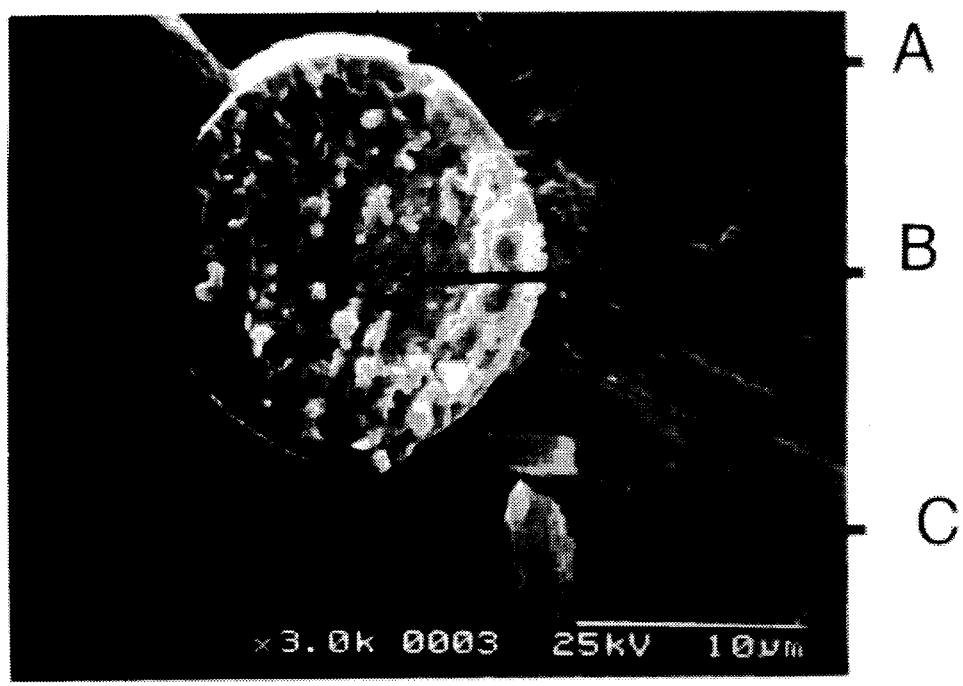
FIG. 3 is a photomicrograph of the filament produced by the method of the present invention after heat treatment.
Figure 4:
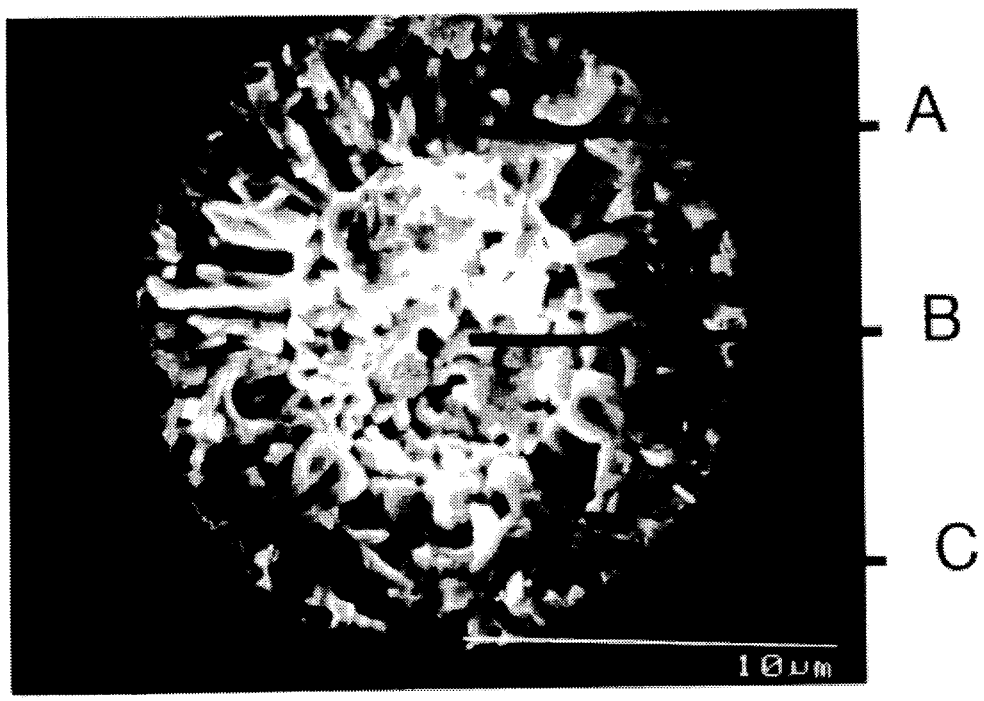
FIG. 4 is a photomicrograph of the control filament after heat treatment.

A composite tungsten/titanium carbide/silicon carbide filament prepared according to the present invention as illustrated with reference to FIG. 1 and having a TiC coating of thickness of less than 0.5 microns was subjected to a temperature of 1100° C. for 75 hours in vacuum. A conventional tungsten/silicon carbide filament was present in the same reaction chamber as a control. FIGS. 2, 3 and 4 show sections of the fracture surfaces of the as-produced filament; the filament after heat treatment of 1100° C. for 75 hours; and the control after heat treatment at 1100° C. for 75 hours respectively. In each figure (A) represents the titanium carbide coating; (B) represents the tungsten core; and (C) represents the silicon carbide coating.

It can be seen that there is an extensive reaction zone in the control (FIG. 4). The heat treated tungsten/titanium carbide/silicon carbide filament (FIG. 3) appears very similar to the as-produced specimen (FIG. 2). Thus, the layer of titanium carbide acts as a very effective barrier layer.

Mechanical Test

Figure 5:
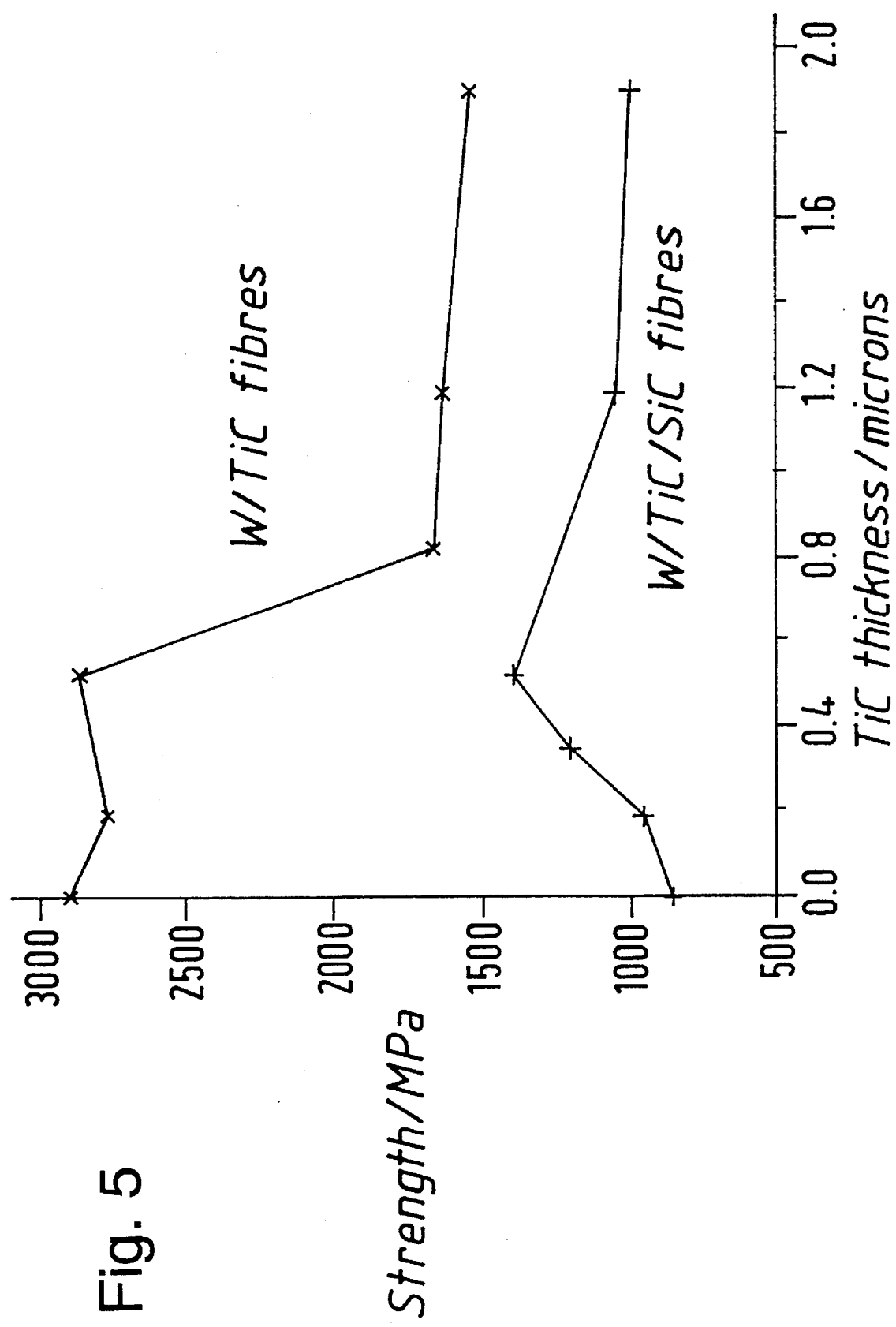
FIG. 5 is a graph of strength versus thickness for fibers.

FIG. 5 shows the initial strengths of tungsten/titanium carbide and tungsten/titanium carbide/silicon carbide filaments at room temperature as a function of the thickness of the titanium carbide layer. It can be seen that for thicknesses up to 0.5 microns, the strengths of the tungsten/titanium carbide filaments are unaffected and the strengths of the tungsten/titanium carbide/silicon carbide filaments increase.

We claim:

1. A process for continuous deposition of a titanium carbide coating of a tungsten filament which comprises the steps of:

heating the filament to a temperature of from 900° C. to 1200° C.; and passing the heated filament through a deposition chamber containing gases, which, upon contact with the heated filament, deposit the coating thereon, said gases comprising a hydrocarbon and a titanium halogenated compound, said passing step including the step of said titanium halogenated compound contacting the tungsten filament before the hydrocarbon.

2. A process according to claim 1 in which the hydrocarbon is a $C_1$ to $C_6$ hydrocarbon and the titanium halogenated compound is titanium tetrachloride.

3. A process according to claim 2 in which the ratio of carbon to titanium atoms is from 0.5 to 4.0.

4. A process according to claim 1 in which the ratio of carbon to titanium atoms is from 0.5 to 4.0.

5. A process for the continuous deposition of a titanium carbide coating on a tungsten filament, said process comprising the steps of:

heating the tungsten filament to a temperature;

first passing the heated filament through a gas comprised of titanium halogenated compound, wherein said temperature of said tungsten filament is sufficient to permit the formation of titanium carbide coating on said filament;

after said first passing step, passing said heated filament through a hydrocarbon gas, wherein during said second passing step, a silicon carbide coating is formed on said titanium carbide coating on said tungsten filament.

6. A process for continuous deposition of a titanium carbide coating on a tungsten filament which comprises the steps of:

heating the filament to a temperature of from 700° C. to 1150° C.; and passing the heated filament through a deposition chamber containing gases, which, upon contact with the heated filament, deposit a coating thereon, said gases comprising a hydrocarbon and a titanium halogenated compound, said passive step including the step of said titanium halogenated compound contacting the tungsten filament before the hydrocarbon.

7. A process according to claim 6 wherein the temperature range of said heating step is from 850° C. to 1050° C.

8. A process according to claim 7 wherein the ratio of carbon to titanium atoms is from 0.5 to 4.0.

9. A process according to claim 6 wherein said hydrocarbon is a $C_1$ to $C_6$ hydrocarbon and the titanium halogenated compound is titanium tetrachloride.

10. A process according to claim 9 wherein the ratio of carbon to titanium atoms is from 0.5 to 4.0.

11. A process according to claim 6 wherein the ration of carbon to titanium atoms is from 0.5 to 4.0.

12. A process for continuous deposition of a titanium carbide coating on a tungsten filament which comprises the steps of:

heating the filament to a temperature of from 700° C. to 1200° C.; and passing the heated filament through a deposition chamber containing gases, which, upon contact with the heated filament, deposit a coating thereon, said gases comprising a hydrocarbon and a titanium halogenated compound, said passive step including the step of said titanium halogenated compound contacting the tungsten filament before the hydrocarbon.

13. A process according to claim 12 wherein said hydrocarbon is a $C_1$ to $C_6$ hydrocarbon and the titanium halogenated compound is titanium tetrachloride.

14. A process according to claim 13 wherein the ratio of carbon to titanium atoms is from 0.5 to 4.0.

15. A process according to claim 12 wherein the ration of carbon to titanium atoms is from 0.5 to 4.0.

16. A process according to claim 15 wherein the ratio of carbon to titanium atoms is from 0.5 to 4.0.

* * * * *